United States Patent [19]

Germer

[11] Patent Number: 4,591,782

[45] Date of Patent: May 27, 1986

[54] POWER SUPPLY AND POWER MONITOR FOR ELECTRIC METER

[75] Inventor: Warren R. Germer, Dover, N.H.

[73] Assignee: General Electric Company, Somersworth, N.H.

[21] Appl. No.: 599,736

[22] Filed: Apr. 12, 1984

[51] Int. Cl.⁴ .................. G01R 11/64; G01R 15/08; G06F 11/00
[52] U.S. Cl. .................. 324/103 R; 324/116; 365/228; 371/66
[58] Field of Search .................. 324/103 R, 116; 364/483; 365/228, 229; 307/68; 371/14, 66

[56] References Cited

U.S. PATENT DOCUMENTS

| | | | |
|---|---|---|---|
| 3,810,116 | 5/1974 | Prohofsky | 365/228 |
| 3,959,778 | 5/1976 | Brette | 307/68 |
| 4,199,717 | 4/1980 | Germer et al. | 324/103 R |
| 4,323,987 | 4/1982 | Holtz et al. | 365/229 |

FOREIGN PATENT DOCUMENTS

2633182  1/1978  Fed. Rep. of Germany ... 324/103 R

*Primary Examiner*—Ernest F. Karlsen
*Attorney, Agent, or Firm*—Robert E. Brunson; Thomas R. Morrison

[57] ABSTRACT

An electronic register for an electric meter includes a non-volatile storage into which data is written upon the detection of an impending power outage. A sufficient quantity of electric energy is normally stored in a capacitor to continue operation of the electronic register for a long enough period of time to complete the writing of data to the non-volatile storage. In order to prevent writing of the data to non-volatile storage in the presence of noise or momentary power outages, when the voltage in the capacitor decays to a point which indicates an impending power outage, a timer is started. If the voltage is not restored before the end of the timing cycle of the timer, then the data is written to the non-volatile storage. If the voltage is restored before the end of the timing cycle, then writing of the data to the non-volatile storage is prevented.

15 Claims, 8 Drawing Figures

POWER SUPPLY AND POWER MONITOR FOR ELECTRIC METER

BACKGROUND OF THE INVENTION

The present invention relates to electric meters and, more particularly, to power supplies and power monitors for electronic demand registers of electric meters.

Conventional electric meters employ an aluminum disk driven as a rotor of a small induction motor by an electric field at a speed which is proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain means for separating the consumption into those parts of comsumption occurring during peak and off-peak hours (however defined) and for recording maximum demand during a predetermined period of time in order to adjust billing according to such parameters. In one such demand meter disclosed in U.S. Pat. No. 3,586,974, a mechanical demand register records the power usage during a predetermined period of time and stores the value for reading. The predetermined period of time may be, for example, the time between meter readings, or a period of time corresponding to the billing period of the utility providing the power. A clockwork mechanism restarts the demand register at the ends of regular demand intervals of, for example, a fraction of an hour, so that, at the end of the predetermined period, the stored value represents the highest value of power usage occurring during any one of the regular demand intervals in the predetermined period.

Demand registers of the mechanical type, such as disclosed in the above U.S. patent, have limited flexibility. Once their design is completed for a particular meter physical configuration, the design is not transferable to a meter having a different physical configuration. In addition, the demand-measurement functions cannot be redefined without major mechanical redesign.

Greater flexibility may be obtainable using electronic acquisition, integration and processing of power usage. An electronic processor such as, for example, a microprocessor may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the power usage during defined periods of time.

An electronic processor of an electronic demand register conventionally employs volatile random access memory for the high speed and low power consumption characteristics offered by such devices. However, several events can occur during normal and emergency conditions which can threaten the integrity of data being recorded for billing purposes in volatile random access memory. If a power outage, by removing power from the processor and the random access memory, were allowed to erase all data stored in random access memory, then the billing data contained in the erased data would be lost. This is, of course, unacceptable. Some means, therefore, appears desirable for storing data in non-volatile memory when a power outage occurs. On the converse, certain normal deviations of the line power, such as, for example, momentary overvoltage, surges, noise and momentary power outages enduring for a very short time period, must be tolerated.

OBJECTS AND SUMMARY OF THE INVENTION

Accordingly, it is an object of the invention to provide an electronic demand register which overcomes the drawbacks of the prior art.

It is a further object of the invention to provide an electronic demand register of the type employing a digital processor and a random access memory which includes means for storing volatile data in a non-volatile storage medium upon the occurrence of a predetermined deviation from normal power conditions but which further includes means for ignoring momentary deviations of the power conditions from normal.

Briefly stated, the present invention provides an electronic register for an electric meter having a non-volatile storage into which data is written upon the detection of an impending power outage. A sufficient quantity of electric energy is normally stored in a capacitor to continue operation of the electronic register for a long enough period of time to complete the writing of data to the non-volatile storage. In order to prevent writing of the data to non-volatile storage in the presence of noise or momentary power outages, when the voltage in the capacitor decays to a point which indicates an impending power outage, a timer is started. If the voltage is not restored before the end of the timing cycle of the timer, then the data is written to the non-volatile storage. If the voltage is restored before the end of the timing cycle, then writing of the data to the non-volatile storage is prevented.

According to an embodiment of the invention, there is provided an electronic register for an electric meter of the type effective to electrically accumulate data representing at least a usage of an AC electric power by a load using an electronic processor, the electronic processor including a volatile data storage comprising a non-volatile data storage, a DC power supply effective for producing at least one DC voltage from the AC electric power, means in the DC power supply for storing a predetermined quantity of stored electric energy during normal delivery of electric power to the load, sensing means responsive to a predetermined level of depletion of the stored electric energy for writing at least some of data from the volatile data storage to the non-volatile data storage, the predetermined quantity of stored electric energy being sufficient to maintain the data in the volatile data storage and to transfer the data to the non-volatile data storage in the absence of the electric power to the load and the sensing means including means for preventing the writing in response to a power outage which continues for less than a predetermined period of time.

According to a feature of the invention, there is provided a method for controlling an electronic register of an electric meter of the type effective to electrically accumulate data representing at least a usage of an AC electric power by a load using an electronic processor, the electronic processor including a volatile data storage comprising producing at least one DC voltage from the AC electric power, storing a predetermined quantity of stored electric energy during normal delivery of electric power to the load, sensing a predetermined level of depletion of the stored electric energy for writing at least some of data from the volatile data storage to a non-volatile data storage, the predetermined quantity of stored electric energy being sufficient to maintain the data in the volatile data storage and to transfer the data to the non-volatile data storage in the absence of the electric power to the load and preventing the writing in response to a power outage which continues for less than a predetermined period of time.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be adapted to any suitable style of electric meter which employs an element rotating at a speed proportional to power consumption, including single phase meters with one or more current windings and polyphase meters, for concreteness, the detailed description which follows is directed toward an illustrative example of a 2-wire single phase meter of the type having a single current coil and a single voltage coil.

Figure 1:
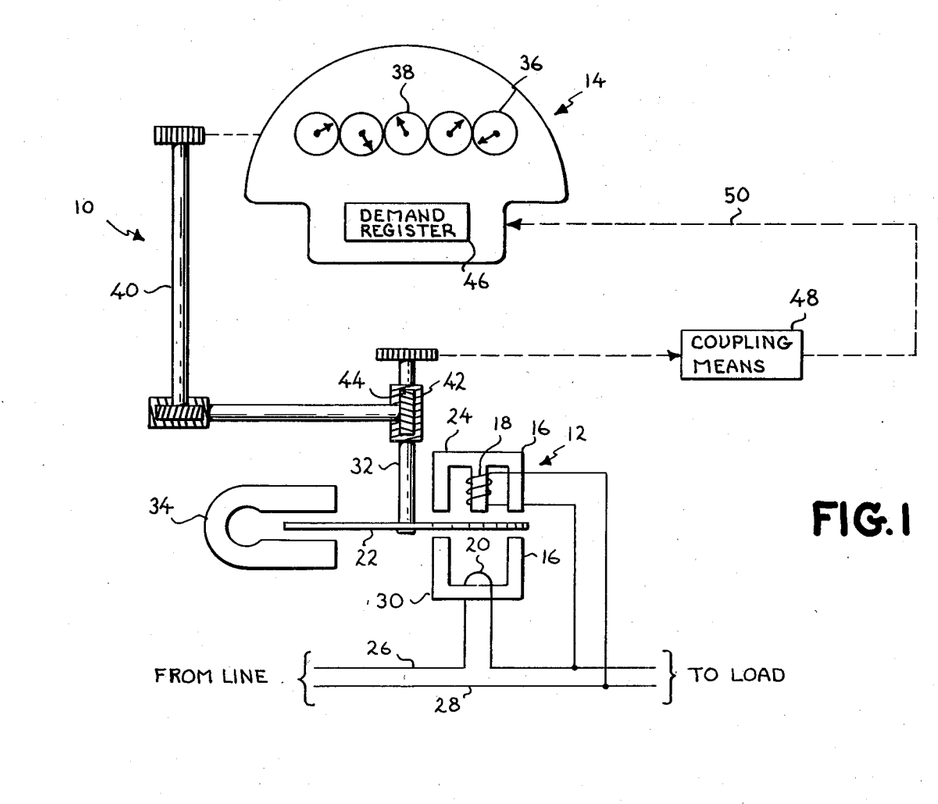
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically one or two, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20 combined with the retarding torque produced by permanent magnet 34 is effective to rotate disk 22 at a speed which is proportional to the product of the voltage and the current, that is, the power, consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, which engages and rotates a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials or indicating devices in the mechanical embodiment of demand register 46 are urged forward for a fixed period of time by a pusher mechanism (not shown). The pusher mechanism is reset and restarted at the end of each of the fixed periods of time, leaving the indicating devices with an indication proportional to the power usage (the demand) during the fixed period of time. The indication on the indicating devices at any time is, therefore, the highest demand which has occurred during any of the time periods since the last time the indicating devices were reset. The recorded demand is employed in billing. In the present invention, demand register 46 is an electronic demand register.

Figure 2:
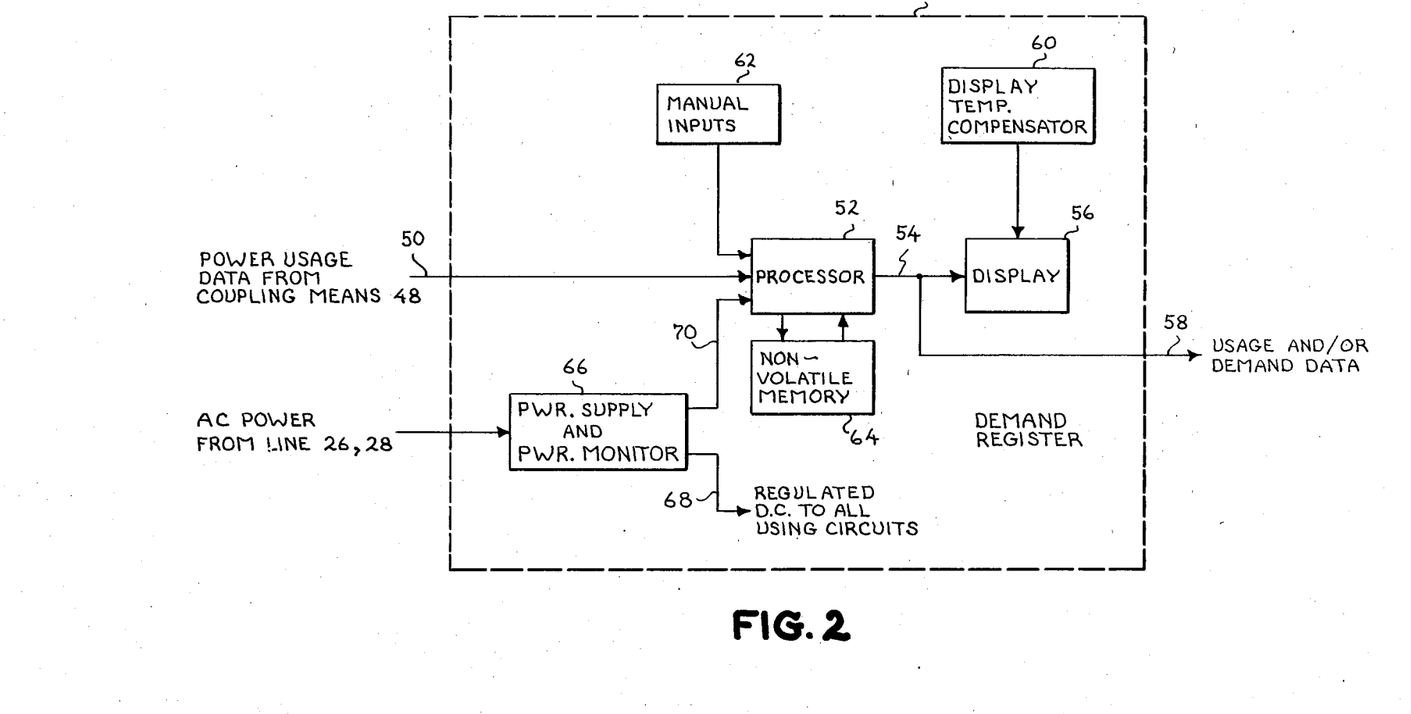
FIG. 2 is a block diagram of a demand register of FIG. 1 according to an embodiment of the invention.

Referring now to FIG. 2, there is shown, a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency, which is variable in dependence on the rate of power usage. Any suitable electronic signal generating apparatus, such as disclosed in the referenced prior patents, may be employed to produce a power usage signal which is applied on a line 50 to a processor 52 in demand register 46. Processor 52 appropriately performs calculations on the usage data to derive desired demand parameters and stores the result. In addition, processor 52 may provide an output on a line 54 suitable for driving a display 56. In addition, the stored data may be transmitted on a line 58 to a remote location (not shown) for further analysis and/or billing.

Due to the extremes of environment in which electric meters may be used, display 56 may need special compensation for environmental parameters. Such special compensation may include a display temperature compensator 60 whose detailed structure and function are not of interest to the present disclosure.

The data which processor 52 transmits for display and/or the manner in which processor 52 operates on the input data to produce internally stored values may be modified according to a manual input 62 which is not of concern to the present disclosure.

As previously noted, processor 52 conventionally employs volatile random access memory elements which lose any data stored in them in the event of a power outage. This is usually not acceptable in an electric meter where such loss of usage and/or demand data has a negative financial impact on the utility supplying the electric power. Non-volatile storage elements such as, for example, electrically erasable programmable read only memory elements, are well known for use with processor 52. However, such non-volatile storage elements normally have relatively slow memory erase and write times on the order of 10 or 20 milliseconds. This is too slow for most applications. In addition to this drawback, the power required to write such memory elements is quite high compared to that required by volatile memory elements of processor 52. Finally, a wear-out mechanism in electrically erasable programmable read only memory cells limits the number of times they can be erased and re-recorded. About 10,000 cycles of write and erase brings such a memory element to the end of its reliable useful life. Memory elements in processor 52 must, of course, be written and erased many thousands of times a day. Thus, an electrically erasable programmable read only memory would have a very short life as the operating memory for processor 52. In its role in non-volatile memory 64, however, electrically erasable programmable read only memory elements are erased and rewritten only when a relatively serious power outage occurs and possibly during a relatively small number of test cycles. Such operations are not expected to occur on a frequent enough basis in the register of an electric meter to represent a limit on the life of the register.

In order to provide safe storage for data and/or programmed constants during a power outage, a conventional non-volatile memory 64 is provided into which such data and constants can be written in the event of a power outage and from which the data and constants can be again read upon restoration of normal conditions.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to certain detected conditions, applies control signals on a line 70 to processor 52 which controls the transfer of data from processor 52 to non-volatile memory 64 in the event of an apparent power outage and resets processor 52 in the event of an actual power outage.

Figure 3:
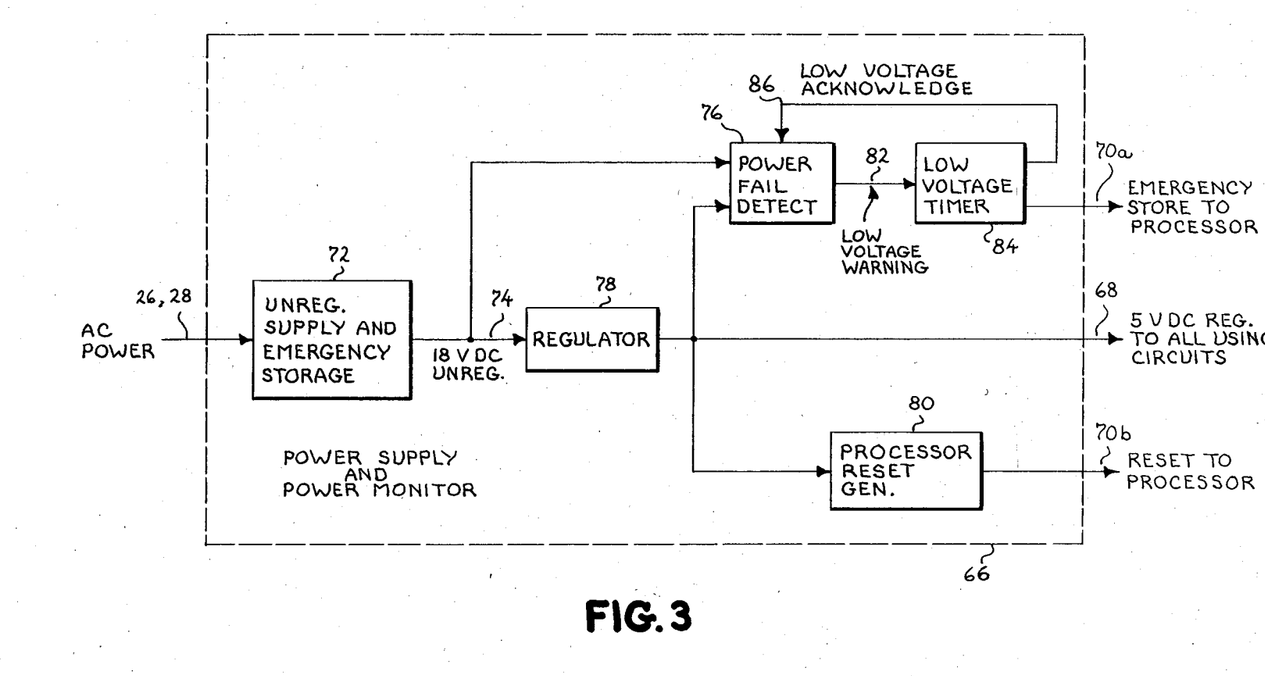
FIG. 3 is a block diagram of a power supply and power monitor of FIG. 2.

Referring now to FIG. 3, the AC power on lines 26 and 28 is fed to an unregulated supply and emergency storage 72 which includes a rectifier for rectifying the AC power to produce a pulsating unregulated DC output on a line 74. The unregulated DC power on line 74 may have any convenient voltage such as, for example, 18 volts. Unregulated supply and emergency storage 72 also includes sufficient capacitive storage to maintain power to critical circuits in demand register 46 for a long enough period after an apparent power outage is detected to permit transfer of billing data and programmed constants from the volatile random access memory in processor 52 to safe storage in non-volatile memory 64.

The unregulated DC power on line 74 is applied to inputs of a power failure detector 76 and a regulator 78. Regulator 78 produces a regulated DC output voltage which is applied on line 68 to using circuits throughout demand register 46. In addition, the regulated DC output of regulator 78 is applied to inputs of power failure detector 76 and a processor reset generator 80. In summary, when a momentary power outage on lines 26 and 28 cause the voltage of the unregulated DC voltage to fall below a first threshold value, a timer is started. If the unregulated DC voltage does not rise above a second threshold, slightly higher than the first threshold before the timer times out, processor 52 is commanded to transfer billing data and programmed constants to non-volatile memory 64. The energy stored in unregulated supply and emergency storage 72 is sufficient to maintain operation of all functions in demand register 46 for a period of power outage which includes a time required for the unregulated voltage to decay to the first threshold, the timing cycle of the timer and the time required to store the data in non-volatile memory 64. Finally, if the regulated supply voltage falls below a third threshold at which processor 52 is no longer able to reliably maintain its operating conditions, a reset signal is produced to reset processor 52. The third threshold is set low enough that all data is safely stored in non-volatile memory 64 before a reset signal may be generated.

The regulated DC output of regulator 78 is applied to a second input of power failure detector 76 and to an input of a processor reset generator 80. Regulator 78 is capable of maintaining the regulated DC voltage at its full value while the unregulated DC voltage fed to it decays substantially. Thus, the regulated DC voltage is used as a reference in power failure detector 76 to detect the decay of the unregulated DC voltage below the first threshold. When the unregulated DC voltage decays below the first threshold which may be, for example, about 14.8 volts, power failure detector 76 applies a low voltage warning signal on a line 82 to an input of a low voltage timer 84.

Immediately upon receiving the low voltage warning signal, low voltage timer 84 applies a low voltage acknowledge signal on a line 86 to a third input of power failure detector 76. The presence of the low voltage acknowledge signal is effective to raise the threshold above which the unregulated DC voltage must rise before the low voltage warning signal is removed from low voltage timer 84. This second threshold may be, for example, about 15.6 volts. The hysteresis applied by changing the threshold in this way prevents power failure detector 76 from rapidly turning the low voltage warning signal on and off in the presence of small variations in the unregulated DC voltage.

If the timing cycle is not interrupted before its end by the resoration of the unregulated DC voltage to a value above the second threshold, low voltage timer 84 applies an emergency store signal on line 70a to processor 52. This initiates the writing of data from the volatile random access memory in processor 52 to non-volatile memory 64.

The length of the timing cycle of low voltage time 84 is established at a value which is long enough to ensure that the reduction in the unregulated DC voltage probably results from a serious power outage rather than from surges, noise or a purely momentary power outage. The timing cycle must, however, be short enough so that stored energy in unregulated supply and emergency storage 72 remains sufficient at the end of the timing cycle to maintain the necessary functions in demand register 46 for a period beyond the end of the timing cycle and to supply the power required to write data to secure storage in non-volatile memory 64.

Although the amount of energy storage in unregulated supply and emergency storage 72 and the length of the timing cycle of low voltage timer 84 may vary for different applications, in the preferred embodiment, unregulated supply and emergency storage 72 is capable of storing enough energy to maintain demand register 46 for a timing cycle of about 120 milliseconds and then is able to supply about 15 milliamperes for a period of about 250 milliseconds for writing the data to non-volatile memory 64.

Figure 4:
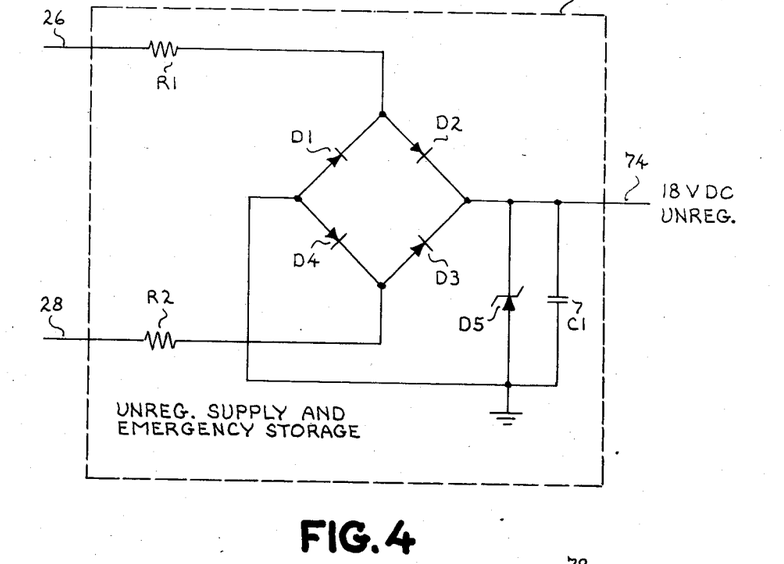
FIG. 4 is a schematic diagram of an unregulated supply and emergency storage circuit of FIG. 3.

Referring now to FIG. 4 the AC supply on lines 26 and 28 is applied through dropping resistors R1 and R2 to a full-wave bridge rectifier composed of diodes D1, D2, D3 and D4. The pulsating DC output of the bridge rectifier is applied to a parallel combination of a breakdown, or avalanche, diode D5 and a storage capacitor C1.

The values of resistors R1 and R2 are chosen to drop the line voltage to a value consistent with the output voltage and current. In the preferred embodiment, a load of from about 5 to about 10 milliamperes may be expected. For this load and an unregulated DC voltage of about 18 volts, the values of resistors R1 and R2 may be about 5K ohms. One skilled in the art would recognize that, in some applications, resistors R1 and R2 may be replaced with a step-down transformer (not shown). If a step-down transformer is employed, a resistor of small value may be inserted in series between the secondary of the transformer and the bridge rectifier to limit the inrush current. For an unregulated DC voltage of 18 volts, breakdown diode D5 may conveniently be a 1N4746 diode having a breakdown voltage of 18 volts.

Storage capacitor C1 must have a capacitance sufficient to permit it to feed energy to the succeeding circuits for the timing period of low voltage timer 84 plus the energy required to write the data into non-volatile memory 64. In the preferred embodiment, a capacitance of about 1000 microfarads appears satisfactory. If the using circuits require more or less energy to safely perform their functions upon the detection of a power outage or, if more or less time is required for completion of the data transfer to non-volatile memory 64, then a larger or smaller value of capacitance in storage capacitor C1 may be required. One skilled in the art with the present disclosure before him would be fully enabled to select an appropriate value of capacitance for storage capacitor C1 without requiring experimentation.

Figure 5:
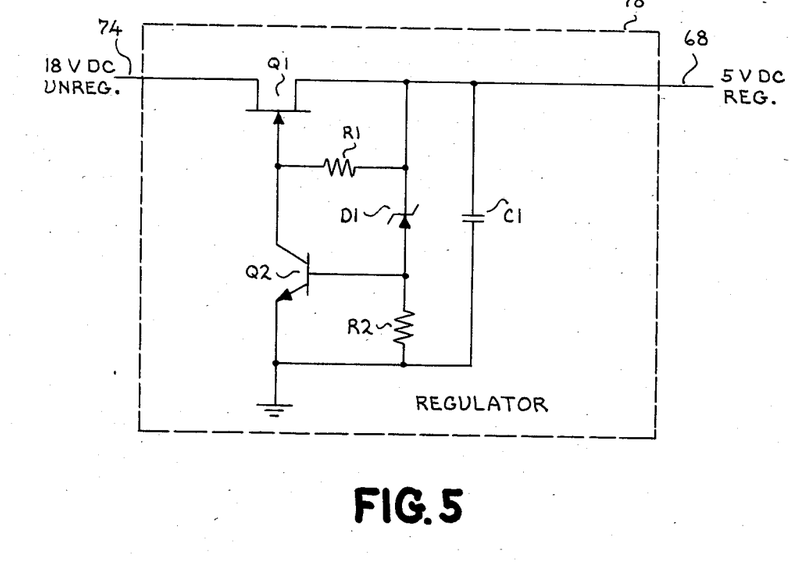
FIG. 5 is a schematic diagram of a regulator of FIG. 3.

Referring now to FIG. 5, regulator 78 is seen to contain a field effect transistor Q1 as a series element and a breakdown, or avalanche, diode D1 as a reference element to control a regulator transistor Q2 which regulates the series resistance of field effect transistor Q1 upward or downward as necessary to closely maintain the output voltage in the vicinity of the desired regulator DC voltage such as, for example, 5 VDC.

Figure 6:
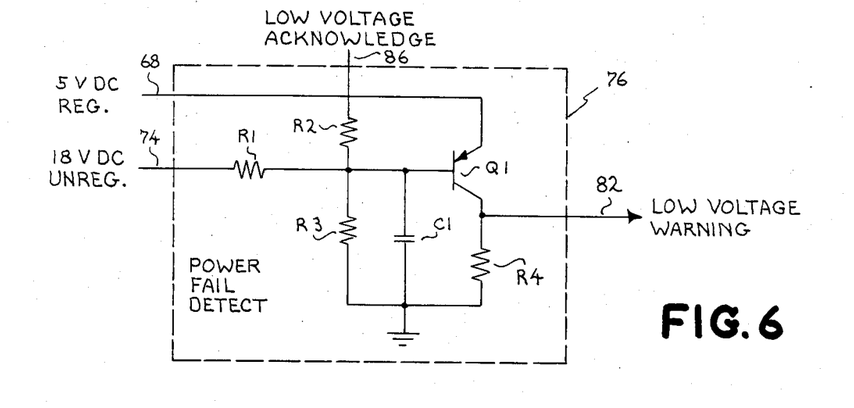
FIG. 6 is a schematic diagram of a power failure detector circuit of FIG. 3.

Referring now to FIG. 6, power failure detector 76 includes a threshold detecting transistor Q1 which receives the regulated DC voltage at its emitter and the unregulated DC voltage through an input resistor to its base. The low voltage acknowledge signal on line 86 is applied to the base of threshold detecting transistor Q1. In addition, a resistor R3 and a capacitor C1 are connected in parallel from the base of threshold detecting transistor Q1 to ground. The collector of threshold detecting transistor Q1 provides the low voltage warning signal on line 82.

In operation, the low voltage acknowlege signal on line 86 is normally high which, in the preferred embodiment, is about +5 volts, and the unregulated DC voltage added to it for application to threshold detecting transistor Q1 is sufficient to normally cut off threshold detecting transistor Q1 by the fact that its base is held more positive than its emitter. The resistance values of resistor R1, R2 and R3 are selected so that, at the first threshold value of, for example, 14.8 volts, the voltage drops in resistors R1, R2 and R3 reduce the voltage applied to the base of threshold detecting transistor Q1 to a value that is less positive than that of the regulated DC voltage. This turns threshold detecting transistor Q1 on and thus applies an approximately 5 VDC output signal on line 82 to represent the low voltage warning. Upon generation of the low voltage warning signal, the low voltage acknowledge signal fed back on line 86 switches from high to low. It thus requires a higher value of voltage on line 74 to cut off threshold detecting transistor Q1 than it did to turn it on.

Low voltage timer 84 may be any convenient device such as, for example, a one-shot multivibrator or an integrated circuit timer. In the preferred embodiment of the invention, however, the availability of processor 52 makes it desirable to employ the timing capabilities of processor 52 rather than to provide a separate hardware element to perform this function. In the preferred embodiment, processor 52 is an NEC7503 microprocessor. This type of microprocessor can be programmed to produce a low on one of its outputs when one of its inputs is driven high. This output is conveniently the source of the low voltage acknowledge signal on low voltage timer 84. Furthermore, when the above input is driven high, processor 52 begins the timing cycle previously described and, if the input does not return low, or floating, before the end of the timing cycle, the data transfer to non-volatile memory 64 is begun.

After the data has been saved in non-volatile memory 64, provided that the power outage does not last long enough to substantially reduce the voltage of the regulated DC supply, when the unregulated DC voltage returns to a value above about 15.6 volts, the low voltage warning signal on line 82 is removed and processor 52 is again enabled to perform normal processing of the usage data.

If the power outage endures long enough that the unregulated DC voltage drops to a value that is no longer high enough to maintain the regulated DC voltage at about its operating value, a reset signal is applied to processor 52 by processor reset generator 80. It is also convenient for processor reset generator 80 to produce a reset signal for processor 52 during normal power-up as the regulated DC voltage rises from zero to its normal value.

Figure 7:
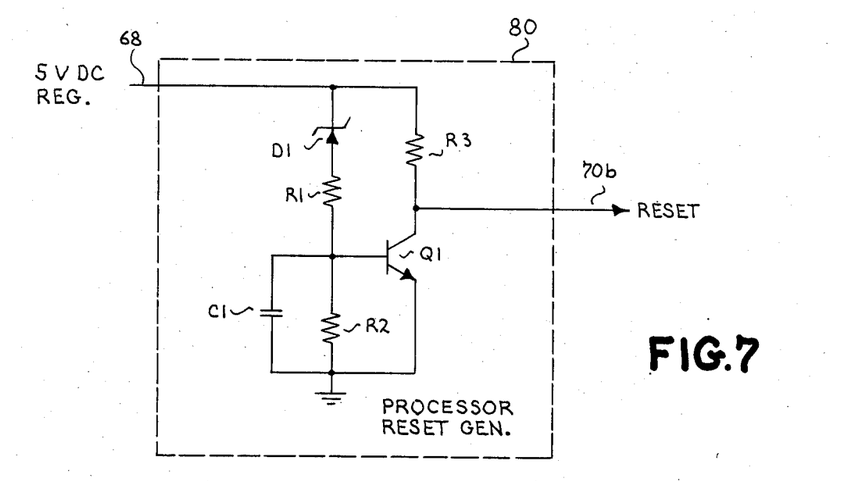
FIG. 7 is a schematic diagram of a processor reset generator of FIG. 3.

Referring now to FIG. 7, processor reset generator 80 is seen to contain a switching transistor Q1 whose base is connected to the regulatod DC supply through a breakdown, or avalanche, diode D1 in series with a resistor R1. A second resistor R2 is connected between the base of switching transistor Q1 and ground. In the preferred embodiment, breakdown diode D1 has a breakdown voltage of about 2.7 volts and resistors R1 and R2 have equal resistance values.

Figure 8:
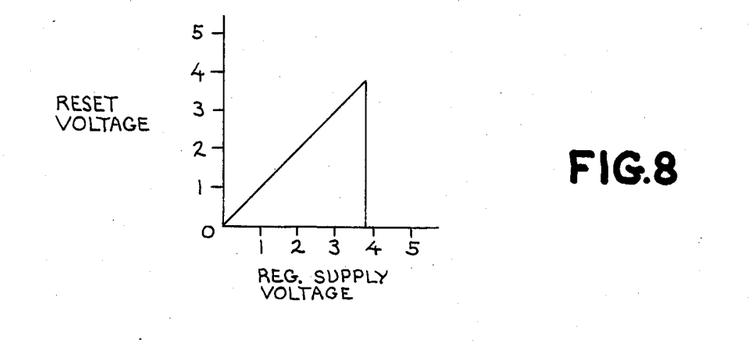
FIG. 8 is a curve showing the reset signal versus regulated DC supply voltage.

In operation, when the regulated DC supply voltage is below a threshold value, switching transistor Q1 is cut off and the reset signal on line 70b follows the regulated DC supply voltage. At and above the threshold voltage, switching transistor Q1 is turned on and thus holds line 70b low. This relationship is illustrated in FIG. 8. When the regulated DC supply voltage decreases from its nominal value of 5 volts to a threshold value of about 3.9 volts the voltage on line 70b jumps from about zero to about 3.9 volts and follows the supply voltage as it decreases. The reset signal as shown in FIG. 8 therefore provides a reset signal both when the regulated DC supply voltage decays below the threshold as well as a normal reset as the regulated DC supply voltage comes up following a power outage or during a normal turn-on.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An electronic register for an electric meter comprising:
   an electronic processor;
   said electronic processor including a volatile data storage;
   a non-volatile data storage;
   unregulated means for producing at least one unregulated DC voltage from an AC supply;
   regulated means for producing at least one regulated DC voltage from said unregulated DC voltage;
   means for storing a predetermined quantity of stored electric energy from said unregulated DC voltage;
   said means for storing being effective for providing a voltage to said regulated means of sufficient amplitude to maintain said regulated DC voltage from said regulated means at its regulated value for at least a first predetermined time following a loss of said AC supply;
   a low voltage timer;
   means for starting a timing cycle of said voltage timer in response to said voltage from said means for storing decaying below a first threshold;
   means for resetting said low voltage timer in response to said voltage from said means for storing increasing above a second threshold;
   means responsive to said low voltage timer completing its timing cycle for writing at least some data from said volatile data storage into said non-volatile data storage;
   said means for storing having a capacity at least sufficient for maintaining functions of said processor until the completion of said timing cycle and said writing; and
   means responsive to a voltage from said regulated means passing a third threshold, lower than said regulated DC voltage, for resetting said electronic processor.

2. An electronic register according to claim 1 wherein said non-volatile data storage includes an electrically erasable programmable read only memory.

3. An electronic register according to claim 2 wherein said means for storing includes a capacitor having a capacitance, regulated said DC power supply including a regulator effective for producing said regulated DC voltage from said unregulated DC voltage in said capacitor, said means for starting a timing cycle includes means effective for comparing a relationship between said unregulated DC voltage and said regulated DC to detect said first threshold.

4. An electronic register according to claim 3 wherein said capacitance is effective to complete said writing after said first threshold is reached.

5. An electronic register according to claim 1 wherein said low voltage timer includes a timing function in said electronic processor.

6. An electronic register according to claim 5 wherein said electronic processor is a digital processor.

7. An electronic register according to claim 6 wherein said digital processor is a microprocessor.

8. An electronic register according to claim 1 wherein said means for resetting includes a switching transistor having a collector-emitter path connected between an output line and ground, a resistor connected from said regulated DC voltage to said output line and means for maintaining said switching transistor cut off when said regulated DC voltage is less than said third threshold and for turning said switching transistor on when said regulated DC voltage exceeds said third threshold whereby a voltage on said output line substantially follows said regulated DC voltage when said regulated DC voltage is less than said third threshold and said voltage on said output line drops to, and remains at, a substantially lower value while said regulated DC voltage exceeds said third threshold.

9. An electronic register according to claim 8 wherein said means for maintaining includes a breakdown diode having a breakdown voltage, said at least one breakdown diode including a first terminal connected to said regulated DC voltage and a second terminal connected to a resistor, said resistor being connected to a control terminal of said switching transistor, said breakdown diode being poled to maintain said control terminal isolated from said regulated DC voltage until said regulated DC voltage exceeds said breakdown voltage.

10. An electronic register according to claim 1 wherein said regulated DC power supply includes a field effect transistor in series with a first current, a control transistor connected to a gate of said field effect transistor and means for controlling a second current in said field effect transistor to a value which maintains a voltage at said gate effective for maintaining said regulated DC voltage from said field effect transistor.

11. An electronic register according to claim 10 wherein said means for controlling a second current includes a breakdown diode having a first terminal connected to said regulated DC voltage and a second terminal connected to a third terminal of a resistor, said resistor having a fourth terminal connected to ground, said transistor including a base connected to said second terminal.

12. An electronic register according to claim 11 wherein said means for controlling a second current further includes a resistor connected between said regulated DC voltage and said gate.

13. An electronic register according to claim 1 wherein said second threshold is a greater voltage than said first threshold.

14. An electronic register according to claim 1 further comprising means for resuming operation of said processor when said voltage from said means for storing increases above said second threshold provided that said voltage from said regulated means remains above said third threshold.

15. A method for controlling an electronic register for an electric meter of a type having an electronic processor, a volatile storage and a non-volatile data storage comprising:

producing at least one unregulated DC voltage from an AC supply;

producing at least one regulated DC voltage from said unregulated DC voltage;

storing a predetermined quantity of stored electric energy from said unregulated DC voltage;

said stored electric energy being of sufficient amplitude to maintain said regulated DC voltage at its regulated value for at least a first predetermined time following a loss of said AC supply;

starting a timing cycle in response to said voltage of said stored electric energy decaying below a first threshold;

resetting said timing cycle in response to said voltage of said stored electric energy increasing above a second threshold;

writing at least some data from said volatile data storage into said non-volatile data storage upon completion of said timing cycle;

resetting said processor in response to said regulated DC voltage passing a third threshold, lower than said regulated DC voltage; and said stored electric energy being at least sufficient for maintaining said regulated DC voltage above said third threshold at least until the completion of said timing cycle and said writing.

* * * * *